(12) United States Patent
Yoshioka et al.

(10) Patent No.: US 8,287,713 B2
(45) Date of Patent: Oct. 16, 2012

(54) METHOD OF PRODUCING BODY HAVING FLOW PATH FORMED THEREIN, AND BODY HAVING FLOW PATH FORMED THEREIN

(75) Inventors: Houkichi Yoshioka, Tokyo (JP); Takahisa Yoshimura, Tokyo (JP); Tohru Natsume, Tokyo (JP)

(73) Assignee: Tecnisco, Ltd., Tokyo (JP)

( * ) Notice: Subject to any disclaimer, the term of this patent is extended or adjusted under 35 U.S.C. 154(b) by 716 days.

(21) Appl. No.: 12/085,147

(22) PCT Filed: Nov. 17, 2006

(86) PCT No.: PCT/JP2006/323519
§ 371 (c)(1),
(2), (4) Date: Aug. 31, 2009

(87) PCT Pub. No.: WO2007/058385
PCT Pub. Date: May 24, 2007

(65) Prior Publication Data
US 2009/0321052 A1 Dec. 31, 2009

(30) Foreign Application Priority Data
Nov. 18, 2005 (JP) .................................. 2005-334046

(51) Int. Cl.
*C25D 1/00* (2006.01)
(52) U.S. Cl. ........................................... 205/67; 205/73
(58) Field of Classification Search ............... 205/67, 205/73
See application file for complete search history.

(56) References Cited

U.S. PATENT DOCUMENTS

| | | | |
|---|---|---|---|
| 5,199,487 A * | 4/1993 | DiFrancesco et al. | 165/168 |
| 5,317,805 A | 6/1994 | Hoopman et al. | |
| 7,161,806 B2 * | 1/2007 | Yanase et al. | 361/707 |
| 2005/0063161 A1 | 3/2005 | Yanase et al. | |

FOREIGN PATENT DOCUMENTS

JP 2005-93781 4/2005

OTHER PUBLICATIONS

International Search Report.

* cited by examiner

*Primary Examiner* — Luan Van
(74) *Attorney, Agent, or Firm* — Smith, Gambrell & Russell, LLP

(57) ABSTRACT

The present invention provides a water-cooled heat sink having an integrated structure, and having inside a precise, freely formed flow path, the water-cooled heat sink being produced without using a technique for pasting a plurality of metal sheets. In a water-cooled heat sink 1, a formed body 2 is provided outwardly, a flow path 3 for passage of a liquid is formed inwardly of the formed body 2, and an inlet 5 and an outlet 4 for the liquid, which communicate with the flow path 3, are formed in the main body of the heat sink 1. The entire formed body 2 of the heat sink 1 is integrally formed by thick coating layers applied by electroplating, and has no joints.

4 Claims, 5 Drawing Sheets

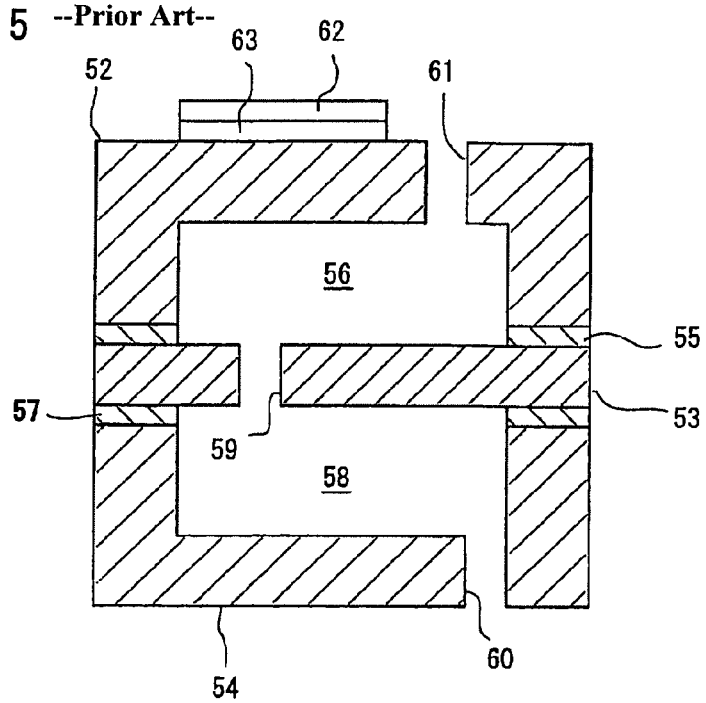
Fig. 5 --Prior Art--
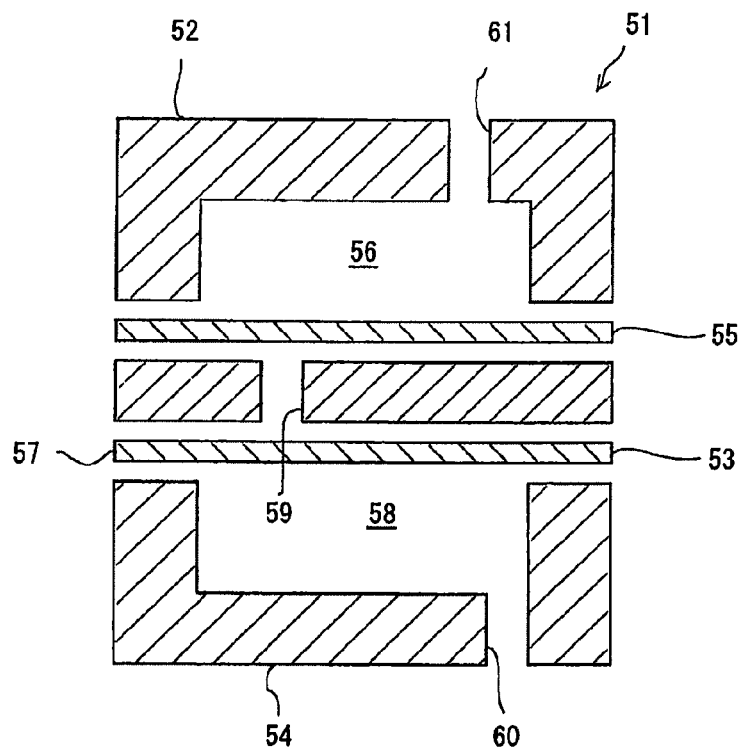
Fig. 6 --Prior Art--

METHOD OF PRODUCING BODY HAVING FLOW PATH FORMED THEREIN, AND BODY HAVING FLOW PATH FORMED THEREIN

TECHNICAL FIELD

This invention relates to a method of producing a body having a flow path formed therein for use, for example, in heat dissipation of a heating element such as a semiconductor laser device or a semiconductor device; and the body having the flow path formed therein.

BACKGROUND ART

In recent years, semiconductor laser devices, semiconductor devices and so on have been used in various fields. Since such devices have large heat release values, heat sinks are generally used for cooling these devices.

Heat sinks are required to have even higher cooling performance responsive to the high intensity and high output of semiconductor devices, etc. in recent years. They are also required to show durability, etc. so as to be capable of cooling the semiconductor devices, etc. stably for long periods. Thus, wide varieties of heat sinks have been devised.

Such heat sinks are showing a tendency toward increases in size and increases in sheet thickness in order to achieve enhanced performance. Thus, it has been desired that the heat sinks be adapted to semiconductor devices, etc. which have been increasingly downsized in recent years.

Under these circumstances, the structure of a water-cooled heat sink 51 (see JP-A-2005-093781) is disclosed.

FIG. 5 is a sectional view of the water-cooled heat sink 51, and FIG. 6 is an exploded sectional view of the water-cooled heat sink 51.

The heat sink 51 has three plate-shaped base materials, i.e., an upper plate material 52, an intermediate plate material 53, and a lower plate material 54. The upper plate material 52 and the lower plate material 54 each have a concave cross-sectional shape, while the intermediate member 53 is in the form of a flat plate. Cu which is a material having excellent heat conductivity is used as the material for these plate materials. The upper plate material 52 is joined onto the intermediate plate material 53 via a solder layer 55, and an upper flow path 56 is formed between the plate materials 52 and 53. The lower plate material 54 is joined to a lower portion of the intermediate plate material 53 via a solder layer 57, and a lower flow path 58 is formed between the plate materials 53 and 54. A through-hole 59 providing communication between the upper and lower flow paths 56 and 58 is formed in the intermediate plate material 53. An outlet 60 for cooling water is formed in the lower plate material 54, and an inlet 61 for cooling water is formed in the upper plate material 52. A semiconductor device 62 cooled by the heat sink 51 is joined to the surface of the upper plate material 52 via a solder layer 63.

The heat sink 51 has a feed water pump (not shown) connected between the inlet 61 and the outlet 60 outside the heat sink 51 so that cooling water flows through the inlet 61, the upper flow path 56, the through-hole 59, the lower flow path 58, and the outlet 60 in this sequence, whereby the heat sink 51 can absorb heat generated by the semiconductor device 62.

The heat sink 51 of the above configuration is constructed by joining in the following manner:

The plate materials 52 to 54 as base materials are readied for use. The upper and lower flow paths 56, 58, the through-hole 59, the inlet 61 and the outlet 60 are formed using a method, for example, a processing method such as cutting, a forming method such as casting or forging, or a surface treatment method such as etching.

As a treatment before joining of the plate materials 52 to 54, it is preferred to perform plasma treatment, in which an inert gas or the like is excited in a vacuum to convert it into a plasmatized state with high reactivity, and the plasma is brought into contact with coating layers, thereby cleaning the surfaces of the respective layers to be joined. By so doing, contaminants which inhibit diffusion joining are removed. The removal of the contaminants may be carried out by other cleaning method such as wet treatment.

The surface of each of the plate materials 52 to 54 cleaned by plasma treatment is coated with a Ni coating layer (not shown), and a Au coating layer (not shown) is coated on the Ni coating layer. Then, the solder layers 55, 57 each of a Au—Sn alloy solder or a pure Sn solder are interposed between the surfaces of the plate materials 52 to 54 to be joined.

The Ni coating layer is used as an adhesive layer coated between any of the plate materials 52 to 54 and the Au coating layer. The Au coating has high corrosion resistance, and is used for preventing corrosion, erosion-corrosion, or electrolytic corrosion which occurs in the heat sink. The joining of the plate materials 52 to 54 by the solder layers 55 and 57 is preferably performed in a reducing atmosphere, or a non-oxidizing atmosphere such as a nitrogen gas or an argon gas, or in a vacuum.

The above-described water-cooled heat sink has excellent heat absorbing properties, but is formed by joining (laminating) the plate material shaving flow paths formed therein, and may be small in size. When the water-cooled heat sink is used under pressure, it may be damaged, if its joint or joining area is not complete.

The present invention has been accomplished in the light of the above-described situations. It is an object of the invention to provide a method of producing a body having a flow path formed therein, the body having an integrated structure, and having inside a precise, freely formed flow path, the body being produced without using a technique for pasting or laminating a plurality of metal sheets; and a water-cooled heat sink produced by the method.

DISCLOSURE OF THE INVENTION

A method of producing a body having a flow path formed therein according to the present invention, for attaining the above-mentioned object, comprises: electroplating a surface of a base material, which has formed therein a flow path-forming portion dissolving in an arbitrary aqueous solution, with a material not dissolvable in the aqueous solution, to form a thick plating layer, thereby surrounding the flow path-forming portion with the plating layer; forming an inlet hole and an outlet hole, which communicate with the flow path-forming portion, in a surface of the plating layer; and flowing the aqueous solution through the inlet hole and/or the outlet hole to dissolve the flow path-forming portion with the aqueous solution, thereby forming the flow path for a fluid, which has a shape corresponding to the flow path-forming portion, inwardly of the plating layer.

A method of producing a body having a flow path formed therein according to the present invention, for attaining the above-mentioned object, comprises: providing a flow path-forming portion in a base material dissolving in an arbitrary aqueous solution; electroplating for a first time a surface of the base material, where the flow path-forming portion has been formed, with a material which is not dissolvable in the aqueous solution, thereby forming a thick plating layer;

removing the base material from the plating layer, while leaving the flow path-forming portion intact, in a composite composed of the base material and the plating layer; electroplating for a second time a surface of the plating layer, where the flow path-forming portion has been disposed, with a material which is not dissolvable in the aqueous solution, to form a thick plating layer, thereby surrounding the flow path-forming portion with the plating layers; forming an inlet hole and an outlet hole, which communicate with a surface of the flow path-forming portion, in a surface of the plating layer; and flowing the aqueous solution through the inlet hole and/or the outlet hole to dissolve the flow path-forming portion with the aqueous solution, thereby forming the flow path for a fluid, which has a shape corresponding to the flow path-forming portion, inwardly of the plating layers.

In the method of producing a body having a flow path formed therein, the body having the flow path formed therein can be a water-cooled heat sink in which the plating layer is formed by electroplating with Cu, and cooling water flows through the flow path.

In the method of producing a body having a flow path formed therein, the base material is Al, and the aqueous solution is an alkaline solution.

In the method of producing a body having a flow path formed therein, a coating film can be formed on a surface of the flow path-forming portion before electroplating performed for the first and second times, the coating film comprising a material having higher corrosion resistance to the fluid than does the material for the plating layer.

A body having a flow path formed therein according to the present invention, for attaining the aforementioned object, comprises: a formed body provided outwardly; the flow path formed inwardly of the formed body for passage of a fluid; and an inlet and an outlet for the fluid formed in the formed body for communication with the flow path, the whole of the formed body being integrally formed by thick plating layers applied by electroplating.

The body having a flow path formed therein can be a water-cooled heat sink in which the formed body is formed by electroplating with Cu, and cooling water flows through the flow path.

An inner surface of the flow path formed in the formed body can be coated with a corrosion resistant film.

The corrosion resistant film can be either a film comprising one of Ti, Ni and Au, or a multilayer film comprising at least two of Ti, Ni and Au. Thus, the inner surface of the formed body can be protected more effectively.

BRIEF DESCRIPTION OF THE DRAWINGS

FIG. 5 is a sectional view of a water-cooled heat sink produced by a conventional lamination method.

FIG. 6 is an exploded sectional view of the water-cooled heat sink shown in FIG. 5.

BEST MODE FOR CARRYING OUT THE INVENTION

A water-cooled heat sink according to an embodiment of the present invention will now be described with reference to the accompanying drawings.

Figure 1:
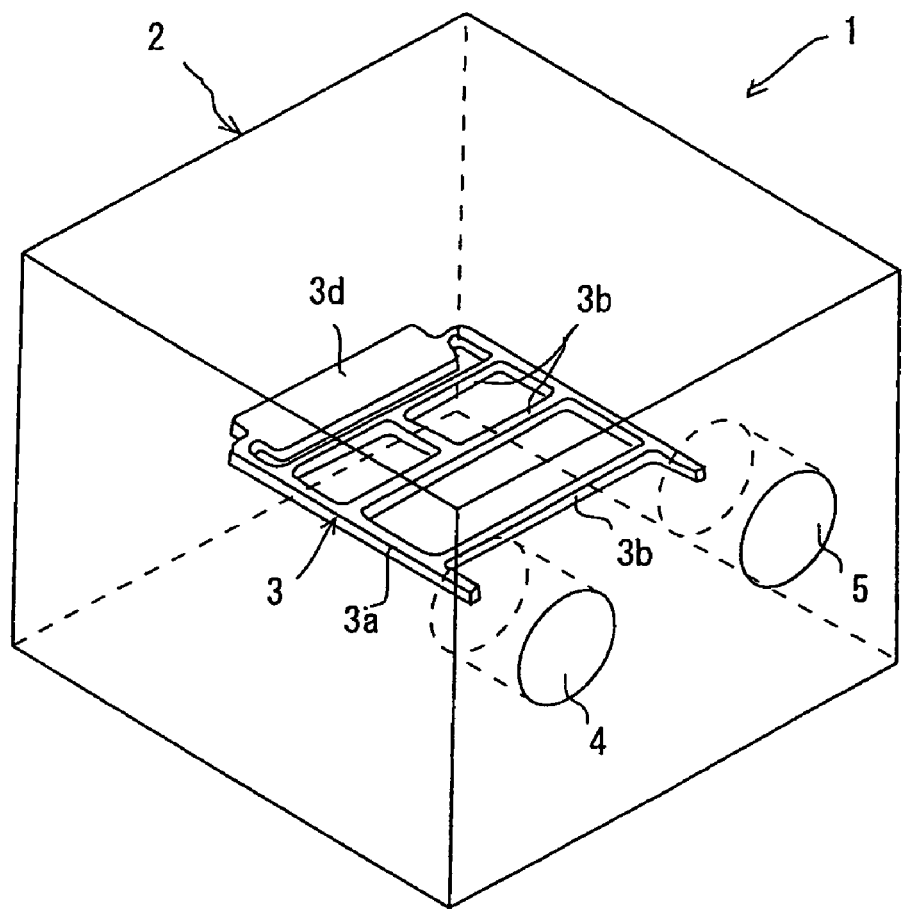
FIG. 1 is a perspective view of a water-cooled heat sink according to an embodiment of the present invention.
Figure 2:
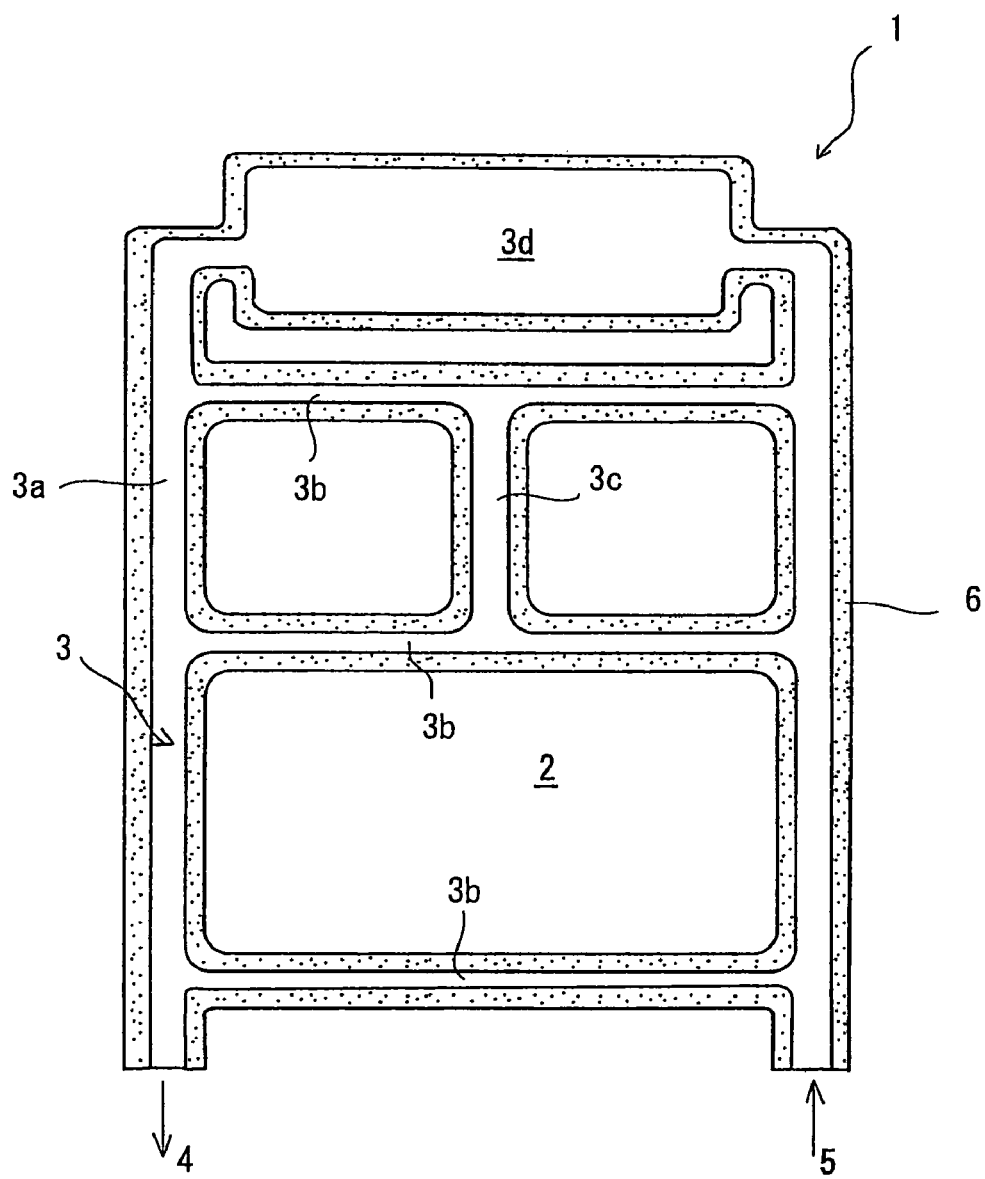
FIG. 2 is an enlarged plan view of a flow path of the heat sink in FIG. 1.

FIG. 1 is a perspective view of a water-cooled heat sink according to the present invention. FIG. 2 is a plan view of a flow path provided within the heat sink.

A water-cooled heat sink 1 has a formed body 2 having a quadrilateral appearance, and a flow path 3 formed therein. A columnar outlet 4 and a columnar inlet 5 for cooling water are formed in a side surface part of the formed body 2, and they are in communication with the flow path 3 for cooling water inside the heat sink 1. The heat sink 1 is formed by thick coating layers applied by electroplating and, in the present embodiment, the entire heat sink 1 is formed from Cu (copper). A coating film 6 comprising Ti (titanium) is coated densely and firmly on the surface of the flow path 3 formed within the heat sink 1. For the coating film 6, Ni (nickel), Au (gold), or Pt (platinum) can be used aside from Ti. Further, the coating film 6 can be a multilayer film comprising at least two of Ti, Ni and Au.

The thickness of the flow path 3 of the heat sink 1 can be set arbitrarily in relation to the size, etc. of the heat sink 1 and, in the present embodiment, is set at 0.2 to 0.3 mm which is the typical value of a water-cooled heat sink.

In the flow path 3, a U-shaped main passage 3a, and a plurality of branch passages 3b connecting opposing regions of the main passage 3a together are formed.

Further, a communication passage 3c connecting the branch passages 3b and 3b together is formed, and a compartment 3d formed with a large width is provided in an intermediate portion in the flow direction of the main passage 3a. The shape of the flow path 3 is not limited, if cooling water smoothly flows inside. The flow path 3 may be a single flow path having none of the branch passages 3b, 3b, the communication passage 3c, and the compartment 3d, or may be a chamber-shaped one like the compartment 3d, or may be of other shape, such as the shape of a crank or an arcuate shape.

The outlet 4 and the inlet 5 of the heat sink 1 are formed at positions in the one side surface portion of the formed body 2. However, the outlet may be provided on an upper surface side of the heat sink 1, and the inlet may be provided on a lower surface side of the heat sink 1, or the outlet and the inlet may be formed on one side wall and the other side wall, respectively. Alternatively, there may be a plurality of the flow paths 3, a plurality of the outlets 4, and a plurality of the inlets 5.

A semiconductor device, which is cooled by the heat sink 1, is installed so as to contact any of the surfaces of the heat sink 1. The semiconductor device is mounted on the heat sink 1 by use of a solder or an adhesive (see FIG. 5). On the other hand, the heat sink 1 can be fixed to a substrate or the like by means of an adhesive, or can be fixed to the substrate by a screw or the like inserted through a through-hole formed in a wall portion of the heat sink 1 where the flow path 3 is not located. The heat sink 1 is formed by electroplating, as mentioned above, without mechanical joints or joining areas.

The method of producing the flow path for cooling water in the heat sink will be described with reference to FIGS. 3A to 3D and 4A to 4D.

Figure 3:
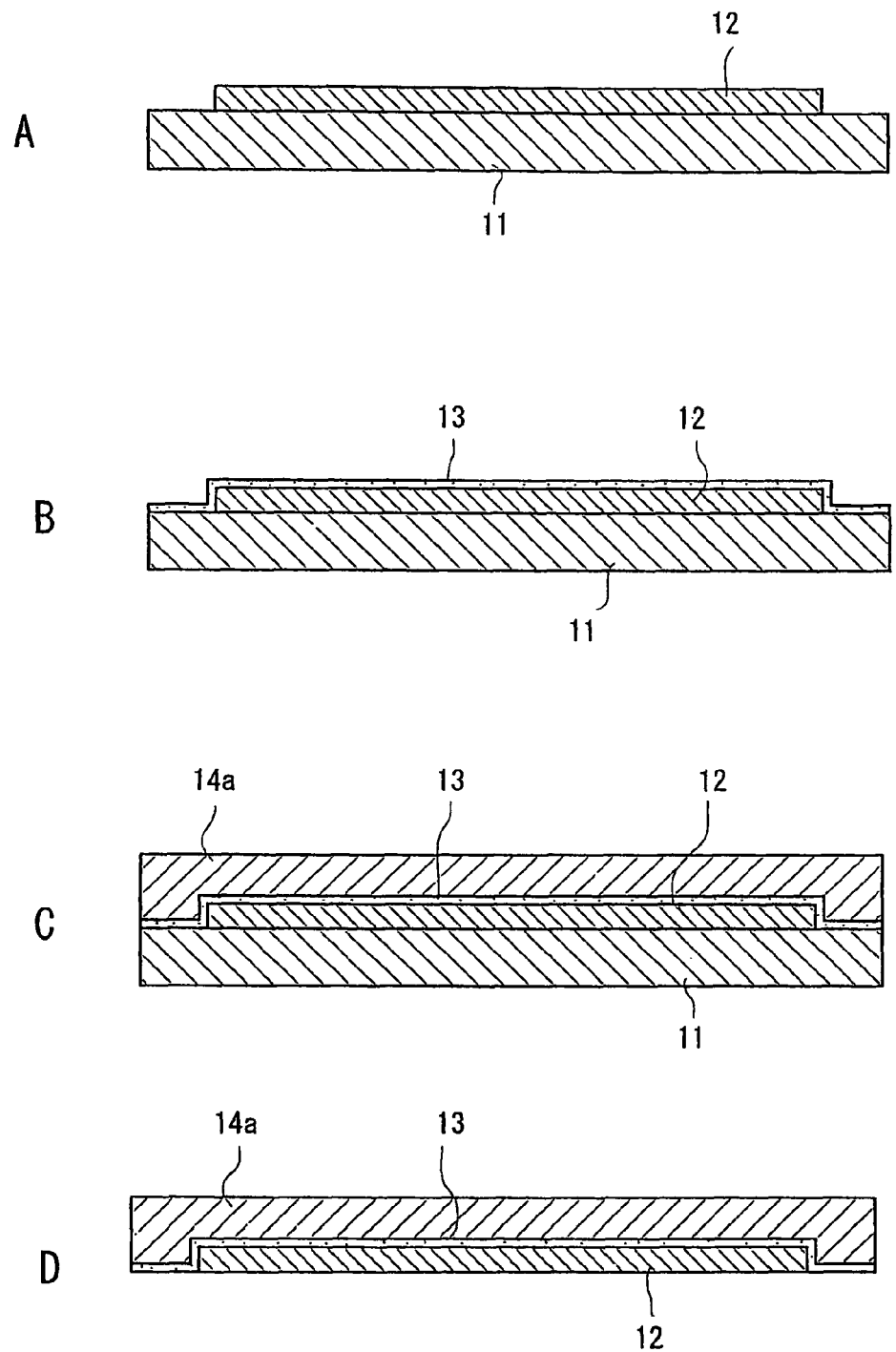
FIG. 3A is a sectional view showing an Al base material having a rib-shaped convexity (the base material and the convexity are formed in a single piece structure, but are differently hatched) formed by etching.
FIG. 3B is a sectional view showing a metallized deposited film formed on the surface of the convexity.
FIG. 3C is a sectional view showing a primary plating layer formed on the surface of the convexity via the metallized deposited film by primary electroplating (i.e., plating by electroforming).
FIG. 3D is a sectional view showing the primary plating layer from which the Al base material has been detached by cutting.

First of all, the surface of a base material 11, which comprises a flat plate-shaped Al (aluminum) sheet, is subjected to patterning by etching to form a convexity 12 later serving as a flow path for cooling water, as shown in FIG. 3A. The convexity 12 can be formed by a method such as machining or photolithography aside from etching.

Then, a coating film 13 of Ti is formed, as shown in FIG. 3B. The coating film 13 is a thin film formed on the surface of the Al material, as the base material 11, by using a metallized film deposition technique as such. The metallized film deposition technique is usually used as a technology for forming a dense and firm thin metal film on the surface of an insulator such as alumina ceramic. The thickness of the coating film 13 is about 0.1 to 10 μm. As the material for the coating film 13, Cr, Ni, Au or the like is used aside from Ti, and any of these materials is chosen, as appropriate, according to uses of a liquid passing through the inner wall of the flow path. The coating film 13 may be formed by deposition using sputtering, or otherwise by plating.

The coating film 13 is not necessarily an essential member for the flow path for cooling water. Moreover, the coating film 13 may cover both the surface of the base material 11 and the convexity 12, or may cover only the convexity 12.

As shown in FIG. 3C, electroplating is performed for the first time (herein after will be referred to as primary electroplating) on the surface of the base material 11 on the side where the convexity 12 has been formed. The primary electroplating takes place by plating Cu in a thick film on the surface of the base material 11. The electroplating is the application of a so-called ultra-thick copper plating provided to a wall thickness of the order of about 0.1 to 10 mm. The operating time for the plating is about 1 week or so (differs according to conditions), but the plating operation does not require labor aside from time, because the copper plating being formed may substantially be allowed to stand.

Figure 4:
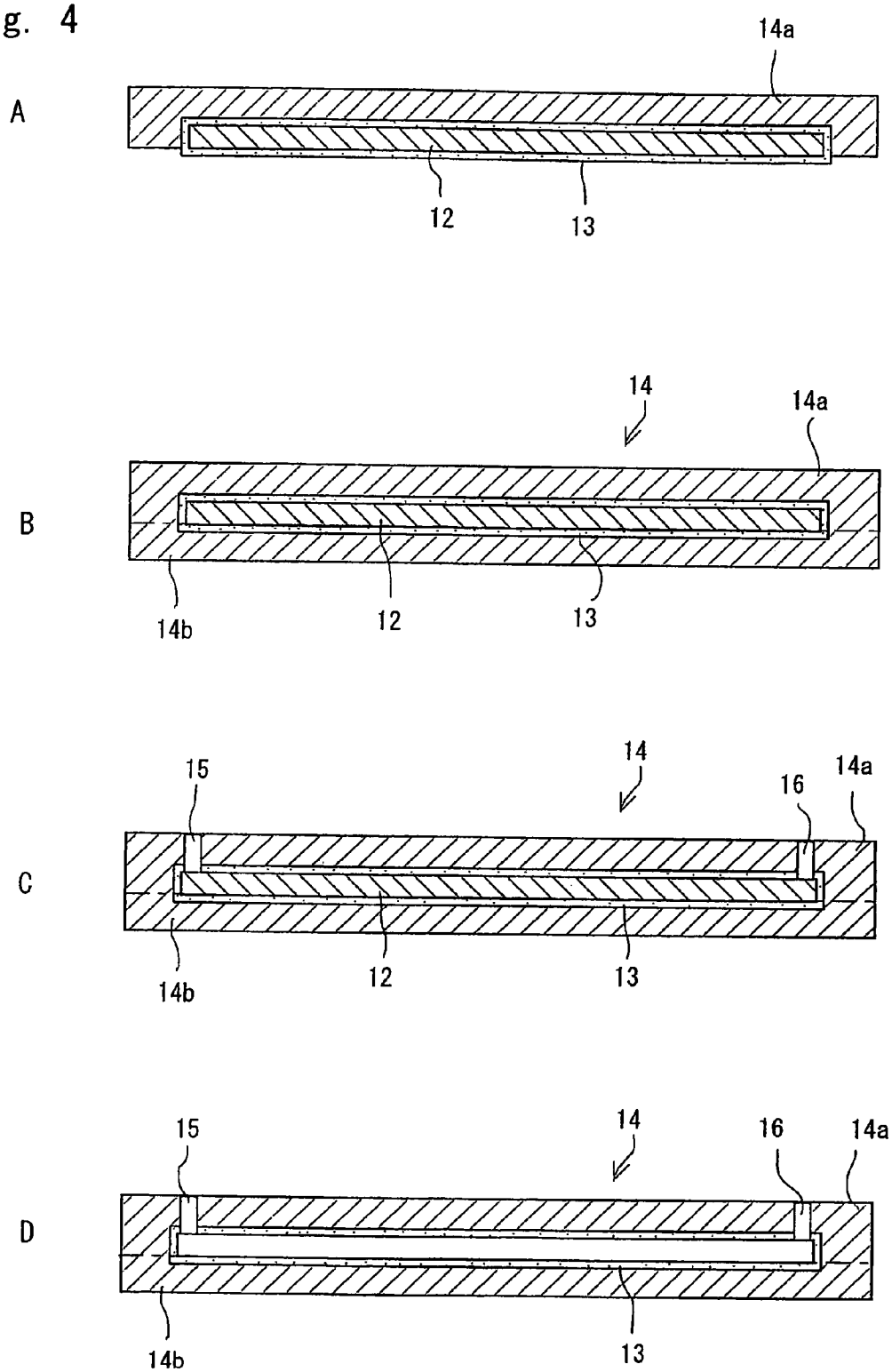
FIG. 4A is a sectional view showing a step subsequent to the step shown in FIG. 3D, in which a metallized deposited film is formed on the surface of the convexity.
FIG. 4B is a sectional view showing a secondary plating layer applied to the primary plating layer.
FIG. 4C is a sectional view showing holes formed to provide communication between the outside and the convexity.
FIG. 4D is a sectional view showing a flow path formed by melting the convexity within the main body of the heat sink.

After a thick primary plating layer 14a covering the convexity 12 is formed as shown in FIG. 3C, the base material 11 is removed by machining, such as polishing or cutting, with the convexity 12 of the base material 11 being left intact, as shown in FIG. 3D. The primary plating layer 14a having the convexity 12 embedded therein is formed in this manner. Thus, the base material 11 has been removed from the surface of the primary plating layer 14a, with the portion of the convexity 12 remaining. In this state, in the portion where the convexity 12 is embedded, the coating film 13 has been formed between the primary plating layer 14a and the convexity 12. On the surface of the convexity 12 exposed to the outside, however, the coating film 13 has not been formed. As shown in FIG. 4A, therefore, a coating film 13 is formed on the surface of the convexity 12, whereby the convexity 12 has its entire surface coated with the coating film 13 using Ti.

Then, as shown in FIG. 4B, electroplating is performed for a second time (herein after will be referred to as secondary electroplating) on the surface of the primary plating layer 14a where the convexity 12 is present. According to the secondary electroplating, an ultra-thick secondary plating layer 14b is formed on the surface of the primary plating layer 14a, or on the surface of the convexity 12 via the coating film 13, similarly to the primary electroplating. Hereinafter, the primary plating layer 14a and the secondary plating layer 14b shown in FIG. 4B are collectively called a formed body 14 of the heat sink.

In this state, the formed body 14 comprising the Cu plating layers is formed so as to wrap the convexity 12 comprising Al and the coating film 13 formed around the convexity 12.

FIG. 4C shows a state in which holes 15, 16 extending through the surface of the formed body 14 to reach the convexity 12 have been formed by machining. These holes 15, 16 serve as the outlet and inlet of the completed heat sink. Advisably, a coating for preventing corrosion is applied to the holes 15, 16.

Finally, the formed body 14 is immersed, unchanged, in a dissolving vessel or dissolver storing an alkaline solution. Since Al has the property of being dissolved with the alkaline solution, the alkaline solution passes through the holes 15, 16 and gradually dissolves the convexity 12 formed of Al. By contrast, Ti of the coating film 13 and Cu of the formed body 14 do not dissolve in the alkaline solution. As shown in FIG. 4D, therefore, only the convexity 12 is dissolved to form a space, which becomes a flow path, within the formed body 14. The heat sink is thus completed.

Al (or Al alloy) is used as the base material, because its forming is easy. Cu is used as the formed body, because the difference in thermal expansion coefficient between Cu and Al is small. The small difference in thermal expansion coefficient is preferred for decreasing the stress of plating, thus solving the problem of peeling at the interface between the base material and the formed body. The thermal expansion coefficient of Al is 23 ppm/k, and the thermal expansion coefficient of Cu is 16 ppm/k, so that the difference in thermal expansion coefficient between them is as small as 7 ppm/k.

The thermal expansion coefficients of the respective materials are 13 ppm/k for Si, 13 ppm/k for Ni, 6 ppm/k for Cr, 14 ppm/k for Au, and 3 to 4 ppm/k for glass. Thus, if Si is used as the base material, and Cu is used for the formed body, the difference in thermal expansion coefficient between them is 3 ppm/k, which is preferred from the viewpoint of thermal expansion coefficient. However, the processability of Al is better than that of Si. Si dissolves in the alkaline solution as does Al.

The above-mentioned convexity 12 plays the role of a core of a mold. Thus, the relationship among the formed body 14, the convexity 12, and the dissolving liquid or solution for dissolving the convexity 12 is advisably such that the formed body 14 has the property of not dissolving in the dissolving liquid, but the convexity 12 has the property of dissolving in the dissolving liquid.

As a combination of the base material and an acidic solution dissolving it, glass and hydrofluoric acid can be taken as an example. A thick plating of Cu can be formed around a glass mold of the base material, although this has little practical applicability for now. To dissolve glass, hydrofluoric acid is used, and a coating film of Au, Pt or the like, which does not dissolve in hydrofluoric acid, is formed on the surface of glass by sputtering (electroless plating may be used instead) in order to prevent dissolution of Cu. Then, glass is dissolved with hydrofluoric acid to form the formed body.

In some cases, the materials for the primary plating layer 14a and the secondary plating layer 14b can be changed.

The completed heat sink has the semiconductor device mounted on the surface of the heat sink. When the heat sink is mounted on an electronic substrate, feed water piping is connected to the outlet and inlet of the heat sink, and is connected to a pump (not shown). The heat sink itself is lacking in mechanical joints, so that it has high strength and can be used at a high pressure. Since there are no joints, there is no fear of leakage of a cooling fluid due to defects in joints. The heat sink has the inherent cooling ability of a water-cooled heat sink, and can efficiently cool the semiconductor device, etc. Particularly, in forming a fine passage as the flow path, it suffices, and is effective, to impart an extremely small amount of protrusion and an extremely small width to the convexity 12. There is also the advantage that the flow path can be formed in a shape conformed to the convexity 12 formed in the base material 11.

It is of the utmost importance for the heat sink to ensure satisfactory heat conduction. A suitable material for the heat sink is, for example, Cu with satisfactory thermal conductivity (thermal conductivity 400 W/mK), as in the present embodiment. On the other hand, Ni (thermal conductivity is of the order of 70 W/mK, depending on purity) is inferior in thermal conductivity to Cu, but because of high strength, it has the advantage of being usable in a state of use at a high pressure.

In addition, the lost wax process is available which prepares a mold of the same shape as the shape of the desired product with the use of wax, firmly applies a refractory to the periphery of the mold, heats the resulting composite to eliminate the wax, and pours a molten metal into the resultant space, thereby forming a casting. The formed body according to the present invention can increase accuracy, compared with the accuracy of the product of the lost wax process, by a factor of the order of 10 (lost wax process: accuracy of the order of about 0.1 mm, present invention: accuracy of 0.01 mm).

The embodiment of the present invention has been described above, but it goes without saying that the present invention can be modified or changed variously based on its technical ideas.

In the above embodiment, for example, in order to form the fine and complicated flow path, the convexity 12, as the preformed member for the fine flow path, is formed on the base material 11 formed of Al, and then the electroplating is performed twice. If the complicated flow path is not formed, for example, if the flow path is a simple space (like the compartment 3d of FIG. 1), electroplating may be directly applied to the face and back of the Al base material in the shape of a thin sheet. That is, upon single electroplating, a thick plating of Cu or the like may be applied to the entire periphery of Al, and then the base material 11 may be dissolved to form a flow path.

In the above embodiment, moreover, the flow path is described as the flow path for cooling water in the heat sink or the like. However, the flow path can be used as a flow path for a gas as well as a liquid, and trace amounts of gases can be mixed by utilizing the fine flow path. Alternatively, the flow path can be used as a flow path for a mixture of a liquid and a gas.

As described above, the method of producing a body having a flow path formed therein according to the present invention comprises electroplating a surface of a base material, which has formed therein a flow path-forming portion dissolving in an arbitrary aqueous solution, with a material not dissolvable in the aqueous solution, to form a thick plating layer, thereby surrounding the flow path-forming portion with the plating layer; forming an inlet hole and an outlet hole, which communicate with the flow path-forming portion, in a surface of the plating layer; and flowing the aqueous solution through the inlet hole and/or the outlet hole to dissolve the flow path-forming portion with the aqueous solution, thereby forming the flow path for a fluid, which has a shape corresponding to the flow path-forming portion, inwardly of the plating layer. Thus, the body having the flow path formed therein, which has no joints, can be formed. Moreover, the whole of the flow path-forming portion is covered with the thick plating. Thus, the heat sink has high strength and can withstand a great pressure by the fluid.

The method of producing a body having a flow path formed therein according to the present invention comprises providing a flow path-forming portion in a base material dissolving in an arbitrary aqueous solution; electroplating for the first time a surface of the base material, where the flow path-forming portion has been formed, with a material which is not dissolvable in the aqueous solution, thereby forming a thick plating layer; removing the base material from the plating layer, while leaving the flow path-forming portion intact, in a composite composed of the base material and the plating layer; electroplating for a second time a surface of the plating layer, where the flow path-forming portion has been disposed, with a material which is not dissolvable in the aqueous solution, to form a thick plating layer, thereby surrounding the flow path-forming portion with the plating layers; forming an inlet hole and an outlet hole, which communicate with a surface of the flow path-forming portion, in a surface of the plating layer; flowing the aqueous solution through the inlet hole and/or the outlet hole to dissolve the flow path-forming portion with the aqueous solution, thereby forming the flow path for a fluid, which has a shape corresponding to the flow path-forming portion, inwardly of the plating layers. Thus, a finer flow path can be formed in addition to the aforementioned effects.

According to the method of producing a body having a flow path formed therein, the body having the flow path formed therein is a water-cooled heat sink in which the plating layer is formed by electroplating with Cu, and cooling water flows through the flow path. Thus, the heat sink can cool the semiconductor device with high efficiency.

According to the method of producing a body having a flow path formed therein, the base material is Al, and the aqueous solution is an alkali solution, thus facilitating the production of the heat sink. This is because Al is soft and easy to process, and has the property of easily dissolving in an alkali solution. Thus, it has the effect of shortening the operating time.

According to the method of producing a body having a flow path formed therein, a coating film can be formed on the surface of the flow path-forming portion before electroplating performed for the first and second times, the coating film comprising a material having higher corrosion resistance to the fluid than does the material for the plating layer.

The body having a flow path formed therein according to the present invention has a formed body provided outwardly. Inwardly of the formed body, the flow path in which a fluid flows is formed. An inlet and an outlet for the fluid, which communicate with the flow path, are formed in the formed body. The entire formed body is integrally formed by thick plating layers applied by electroplating. Thus, the formed body without joints can be obtained. Furthermore, the entire formed body is formed of the thick platings, thus presenting the heat sink with high strength, which can withstand a high pressure from the fluid.

The body having a flow path formed therein is a water-cooled heat sink in which the formed body is formed by electroplating with Cu, and cooling water flows through the flow path. Thus, the heat sink can cool the semiconductor device with high efficiency.

In the body having a flow path formed therein, moreover, the inner surface of the flow path formed in the formed body is coated with a corrosion resistant film. Thus, the corrosion of the formed body can be prevented, and the life of the heat sink can be prolonged.

The corrosion resistant film of the body having a flow path formed therein can be either a film comprising one of Ti, Ni and Au, or a multilayer film comprising at least two of Ti, Ni and Au.

INDUSTRIAL APPLICABILITY

The present invention can be applied in the fields of analytical instruments and analyzers which pass trace amounts of liquids flow being corrosive to flow paths. For example, the present invention is applied to an analytical instrument in which solutions for analysis need to be flowed sequentially in as small amounts as possible, and for which as narrow a flow path as possible is required. In such an analytical instrument, the solution can be pressure-fed in a fine flow path by a nano-flow pump, and the solution in an amount of micrograms can be recovered by the opening and closing of a valve. In this case, a flow path measuring 0.01 to 1 mm (usually, 0.02 to 0.1 mm) is used. The present invention enables such a fine flow path to be applied.

The invention claimed is:

1. A method of producing a body having a flow path formed therein, comprising:
    providing a flow path-forming portion in a base material which is dissolvable in an arbitrary aqueous solution;
    electroplating for a first time on a surface of the base material, where the flow path-forming portion has been formed, with a material which is not dissolvable in the aqueous solution, thereby forming a first thick plating layer;
    removing the base material from the first thick plating layer, while leaving the flow path-forming portion intact, in a composite comprising the base material and the first thick plating layer;
    electroplating for a second time on a surface of the first thick plating layer, where the flow path-forming portion has been disposed, with a material which is not dissolvable in the aqueous solution, to form a second thick plating layer, thereby surrounding the flow path-forming portion with a plurality of thick plating layers;
    forming an inlet hole and an outlet hole, which communicate with a surface of the flow path-forming portion, in a surface of the plurality of thick plating layers; and
    flowing the aqueous solution through the inlet hole and/or the outlet hole to dissolve the flow path-forming portion with the aqueous solution, thereby forming the flow path for a fluid, which has a shape corresponding to the flow path-forming portion, inwardly of the plurality of thick plating layers.

2. The method of producing a body having a flow path formed therein according to claim 1, wherein
    the body having the flow path formed therein is a water-cooled heat sink in which at least one of the first and second thick plating layers is formed by electroplating with Cu, and the flow path is adapted for cooling water to flow therethrough.

3. The method of producing a body having a flow path formed therein according to claim 1, wherein
    the base material is Al, and
    the aqueous solution is an alkali solution.

4. The method of producing a body having a flow path formed therein according to claim 1, wherein
    a coating film is formed on a surface of the flow path-forming portion before electroplating is performed for the first and second times, the coating film comprising a material having higher corrosion resistance to the fluid than does the material for the first and second thick plating layers.

* * * * *